United States Patent [19]

Lehoczky et al.

[11] Patent Number: 4,863,553
[45] Date of Patent: Sep. 5, 1989

[54] METHOD OF PREPARING RADIALLY HOMOGENOUS MERCURY CADMIUM TELLURIDE CRYSTALS

[75] Inventors: Sandor L. Lehoczky; Frank R. Szofran, both of Huntsville, Ala.

[73] Assignee: The United States of America as represented by the Administrator of the National Aeronautics and Space Administration, Washington, D.C.

[21] Appl. No.: 811,309

[22] Filed: Dec. 17, 1985

Related U.S. Application Data

[63] Continuation of Ser. No. 441,896, Nov. 15, 1982, abandoned.

[51] Int. Cl.[4] .......................... C30B 1/06; C30B 1/08
[52] U.S. Cl. ........................ 156/616.41; 156/616.4; 422/249
[58] Field of Search ...... 156/616 R, 616 A, DIG. 72, 156/DIG. 73, DIG. 82; 219/390; 422/249, 241, 242

[56] References Cited

U.S. PATENT DOCUMENTS

| | | | |
|---|---|---|---|
| 3,305,486 | 2/1967 | Prener et al. | 156/616 R X |
| 3,696,038 | 10/1972 | Davies et al. | 156/616 |
| 3,849,205 | 11/1974 | Brau et al. | 156/616 X |
| 3,986,837 | 10/1976 | Sugiyama et al. | 422/248 |
| 4,050,905 | 9/1977 | Swinehart | 156/616 R X |

OTHER PUBLICATIONS

Bartlett et al; The Effects of Growth Speed on the Compositional Variations in Crystals of CdHgTe, J of Crystal Growth 46 (1979), 623–629.

Fiorito et al; A Possible Method for the Growth of Homogeneous Mercury Cadmium Telluride Single Crystals; J. Electrochem. Soc., vol. 125, No. 2 (Feb. '78) 315–317.

Lawson; A Method of Growing Single Crystals of Lead Telluride and Lead Selenide, J. of Appl. Phys., vol. 22, No. 12 (Dec. '51) 1444–1447.

Lawson et al; Preparation of Single Crystals, 1958, p. 13–30.

Primary Examiner—Barry S. Richman
Assistant Examiner—Timothy M. McMahon
Attorney, Agent, or Firm—William J. Sheehan; John R. Manning; Charles E. B. Glenn

[57] ABSTRACT

$Hg_{1-x}Cd_xTe$ is prepared in an improved directional solidification method in which a precast alloy sample containing predetermined amounts of Hg, Cd and Te is disposed in a sealed ampule (12) and a furnace (10) providing two controlled temperature zones (16, 18) is translated upward past the ampule so as to provide melting and resolidification. The present improvement is directed to maintaining the zones at temperatures determined in accordance with a prescribed formula providing a thermal barrier (32) between the zones with a maximum thickness and translating the furnace past the zones at a rate less than 0.31 μm/sec.

6 Claims, 1 Drawing Sheet

METHOD OF PREPARING RADIALLY HOMOGENOUS MERCURY CADMIUM TELLURIDE CRYSTALS

ORIGIN OF THE INVENTION

The invention described herein was made in the performance of work under a NASA Contract and is subject to the provisions of Section 305 of the National Aeronautics and Space Act of 1958, Public Law 85-68 (72 Stat. 435, 42 U.S.C. 2457).

This application is a continuation of application Ser. No. 441,896 filed Nov. 15, 1982, now abandoned.

TECHNICAL FIELD

This invention relates to crystal-growing methods and more particularly to an improved directional solidification method for growing radially homogeneous mercury cadmium telluride crystals.

BACKGROUND ART

The solid solution semiconductor mercury cadmium telluride, $Hg_{1-x}Cd_xTe$ ($0 \leq x \leq 1$), is the material of choice for many infrared detector applications because its properties are uniquely suited to both the detection of infrared radiation and the requirements for fabricating junction devices. HgTe and CdTe are completely miscible in all proportions and form a direct band-gap semiconductor alloy system for which the energy-band gap increases approximately linearly from −0.3 to 1.6 eV as the mole fraction, x, of CdTe increases from 0 to 1. Consequently, the spectral response of HgCdTe can be compositionally tuned between 0.8 and 50 μm to tailor a detector for maximum performance at a given wavelength. However, the preparation of homogeneous, high-quality bulk crystals of this material has proved very difficult owing to segregation during solidification, high volatility of one of the components, and strain fields associated with large temperature gradients.

Various methods have been used for preparation of HgCdTe crystal material, including solid-state recrystallization and melt growth methods. The former method, in which precast polycrystalline ingots are grain-growth annealed to improve crystallinity and homogeneity, is an extremely slow process and often results in high densities of microstructural crystal defects, e.g., dislocations, small-angle grain boundaries and second-phase precipitates, that can seriously limit state-of-the-art device performance. In regard to melt-growth methods, HgCdTe has been prepared by directional solidification in which a precast ingot in an ampule is melted and recrystallized by positioning the ampule in the upper, hot zone of a furnace that also has a cold, lower zone and slowly moving the furnace upward on vertical ways so that the crystal grows progressively upward from the bottom, tapered end of the ampule (Bridgman-Stockbarger method). This method has presented a serious disadvantage in that the resulting material shows significant radial variations in ingot alloy composition. Requirements for large area focal plane arrays for IR detectors necessitate compositional uniformities of $\Delta x < 0.01$ or less over a crystal slice of 1 cm diameter or larger. Larger compositional variations cause variations in band gap, leading to unacceptably large variations in detector response over the area of the detector. Minimizing compositional variations is thus of primary importance in producing material capable of meeting detector performance requirements.

Some work has been performed on understanding the mechanisms responsible for radial compositional variations in preparation of HgCdTe by directional solidification. For example, Bartlett et al in *Journal of Crystal Growth*, 46,623 (1979) disclose correlations between growth speed and radial compositional variation. However, the relative importance of the various mechanisms that may be involved has not been determined, and substantial improvement is needed to obtain a fully controlled, effective method.

STATEMENT OF INVENTION

In the present invention radially homogeneous, crystalline HgCdTe is prepared by subjecting a precast alloy sample containing predetermined amounts of Hg, Cd and Te in an elongated, sealed ampule to directional solidification wherein the ampule is successively exposed to an upper, hot temperature zone and a lower, cool temperature zone, the temperatures of said zones being selected in accordance with a prescribed formula, the upper and lower temperature zones being separated by a thin barrier and the rate of translation of said zones along the length of said ampule being selected so as not to exceed a maximum value. The HgCdTe prepared by this method shows a high degree of radial homogeneity with variations typically $\pm 0.002$ across an ingot slice 12 mm in diameter, thus providing favorable properties for use in infrared detector devices.

It is therefore an object of this invention to provide a method of preparing crystalline HgCdTe in the form of ingots having minimized radial compositional variations.

Another object is to provide an improved directional solidification process for preparation of HgCdTe.

Another object is to provide a method and apparatus for effective selection and control of temperature zones in directional solidification of HgCdTe.

DETAILED DESCRIPTION OF THE INVENTION

Figure 1:
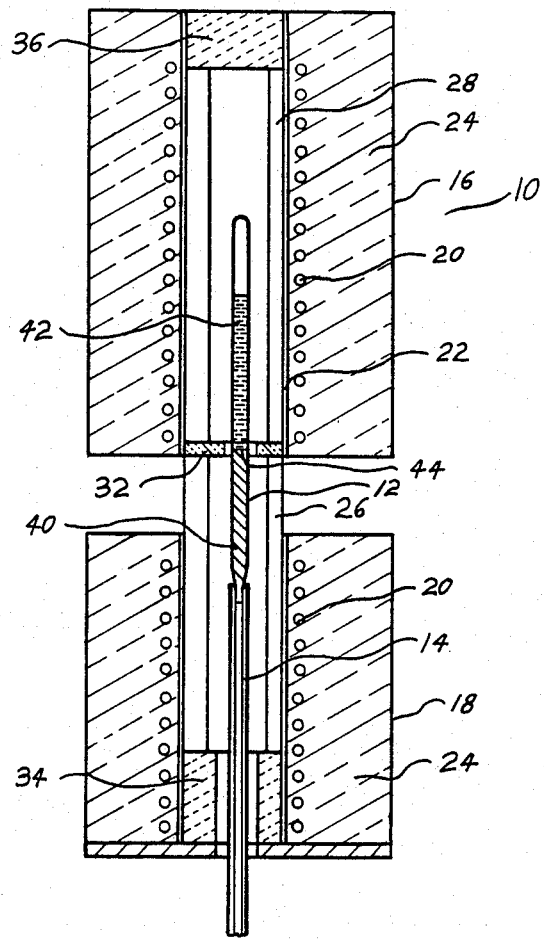
FIG. 1 is a schematic drawing of a directional solidification furnace useable in the practice of this invention.

Referring to the drawings, FIG. 1 shows a furnace assembly 10 for preparation of crystals in accordance with the invention. The furnace is generally cylindrical with an axial opening adopted to receive therein an elongated ampule 12 which contains the crystalline material. The ampule, made of fused silica, is mounted on a stationary pedestal 14, also made of fused silica. Relative movement of the ampule with respect to temperature zones provided by the furnace is obtained by moving the furnace upward past the fixed ampule by means not shown at a predetermined translation rate. The furnace has an upper section 16 and a lower section 18 adapted to provide two discrete temperature zones. Each of the sections is heated by electric heating coils 20 disposed around the central axial opening 22 and insulation 24 filling the space between opening 22 and the outer wall of the furnace.

The furnace sections each have an annular heat pipe 26, 28 disposed in the central opening between the heating coils and the ampule and adapted to provide the required temperature profile. A conventional sodium heat pipe is used for upper section 16, and sodium or mercury heat pipe may be employed in lower section 18, depending on the required temperature. The furnace sections are separated by an annular gap so as to allow effective functioning of heat pipe 26. A thermal barrier 32, in the form of an annular disc obtained from a machineable board of material such as fibrous silica, fibrous alumina, fibrous zirconia, or combination thereof, is disposed between the two heat pipes so as to provide separation of the heated zones produced by each furnace section. Thermal insulating blocks 34 and 36 are disposed in the central opening at the bottom and top, respectively. The HgCdTe sample in ampule 12 exists in solid phase 40 within the temperature zone provided by lower section 18 and in liquid phase 42 within the upper section 16, the phases being separated by interface 44 at thermal barrier 32.

Figure 2:
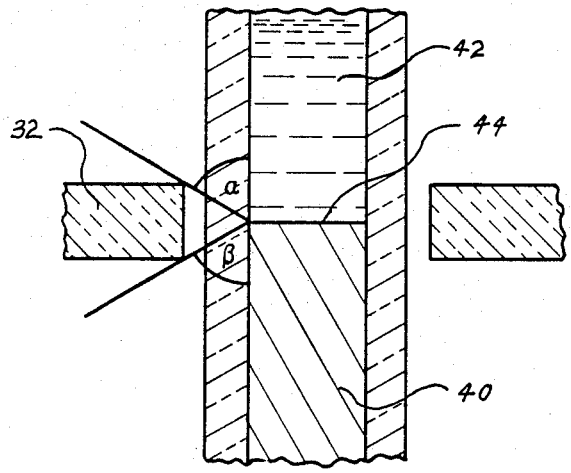
FIG. 2 is an enlarged view of the thermal barrier region of the furnace shown in FIG. 1.

An enlarged view of the interface area of the furnace is shown in FIG. 2. The relative thickness of barrier 32 in relation to the diameter of ampule 12 is depicted, along with the angles $\alpha$ and $\beta$ between the outer sides of liquid and solid phases 42, 40, respectively, and the top and bottom of barrier 32 taken at interface 44. These features are important to attainment of required temperatures as will be described below.

The starting HgCdTe material for crystal growth in the present invention may be prepared by fusing a mixture of high-purity elemental constituents in a sealed, evacuated fused silica ampule. The ampule is first loaded with precisely weighed amounts of Hg, Cd and Te as required for the desired composition, and, after sealing of the ampule, the mixture is fused and cast in a rocking furnace. As shown in FIG. 1, void space is left at the top of the ampule in order to prevent contact of the material with the heated part of the fused silica ampule during sealing. The bottom end of the ampule, where crystallization begins is tapered to enhance the probability of single crystal growth.

The precast alloy in the ampule is then regrown by directional solidification in the apparatus shown in FIG. 1. The ampule is positioned on a pedestal and remains stationary while the furnace assembly travels upward so that the crystal grows progressively upward from the bottom. Separately controlled furnace sections are used for the hot, upper zone and the cold, lower zone, each section being provided with a heat-pipe isothermal furnace liner to produce two well-defined zones.

Ideally, the interface shape and its location in the present method should exist as depicted in FIG. 2, that is, the interface should be flat and in the middle of the thermal barrier between zones. We have found that these conditions can be most nearly realized by selection of zone temperatures according to a prescribed formula and by using a relatively thin barrier. The formula for selection of zone temperatures in Kelvins, is as follows:

$$T_U{}^4 - T_I{}^4 = T_I{}^4 - T_L{}^4$$

where $T_U$ is the upper zone temperature, $T_L$ is the lower zone temperature and $T_I$ is the solidus temperature for the particular material composition. The upper zone temperature $T_U$, is chosen to be slightly above and preferably about 10° C. above, the liquidus temperature for the particular composition. Using values from the known phase diagram for the system, the lower temperature zone can be readily calculated. For example, for preparation of material of the formula $Hg_{0.8}Cd_{0.2}Te$, the liquidus temperature is 792° C. (1065° K.) and the solidus temperature is 706° C. (979K.); thus the selected upper zone temperature would be 1085K.; and the lower zone temperature 820K. (547° C.). The phase diagram for the HgCdTe system is available in the published literature, F. R. Szofran and S. L. Lehoczky, *J. Electronic Materials* 10, 1131 (1981), and is hereby incorporated by reference.

The thickness of barrier is critical to attainment of crystal homogeneity in the present method. The barrier should be as thin as possible so that view-angle projections into the interface region as shown by angles $\alpha$ and $\beta$ in FIG. 2 are as large as possible, while still providing adequate thermal isolation of the heated zones. In general the minimum thickness consistent with a requirement for maintaining thermal isolation between heat pipes of the two zones should be used, and a thickness of 4 mm or less is preferred. Slightly thicker barriers up to 7 mm thick can be used, but only a small central portion of the resulting ingot will show the desired radial homogeneity. This approach to barrier thickness is in contrast to the previously accepted concept that thicker thermal barriers were desireable for the purpose of maintaining flat radial isotherms and thus radially homogeneous melts. We have found that because of the differences between the thermal conductivities in the solid crystal and the melt and because the thermal conductivity of fused silica of the ampule is comparable to that of the alloys, the use of thick barriers results in accentuation of radial temperature gradients.

Crystal growth rate, which is controlled by the rate of translation of the furnace past the ampule, is kept below a maximum value in the present method to avoid loss of radial homogeneity. The furnace translation rate, R, is related to the compositional gradient in the melt ahead of the interface in accordance with the following equation:

$$\left.\frac{dx}{dl}\right|_{l=0} = \frac{x_o R}{D}\left(\frac{k-1}{k}\right)$$

where D is an empirically determined diffusion coefficient, $x_o$ is the initial, overall material composition, k is a segregation coefficient determined from the phase diagram and l is the distance from the interface. This relationship is based on work reported by V. G. Smith, W. A. Tiller and J. W. Rutter, Can. J. Phys. 33, 723 (1953). When dx/dl at the interface exceeds a critical value, compositional redistribution and consequent radial inhomogeneity will result. We have found that for material of the composition $x_o = 0.2$ and at values of D and k of $5.5 \times 10^{-5}$ cm$^2$/sec and 4, respectively, the value of dx/dl at the interface must be less than $8.5 \times 10^{-4}$ cm$^{-1}$ (a translation rate of 0.31 $\mu$m/sec and that best results are obtained at a value of about $1.85 \times 10^{-4}$ cm$^{-1}$, which results in a translation rate of 0.068 $\mu$m per second.

The invention is further illustrated by the following specific examples.

EXAMPLE I

An HgCdTe alloy of the overall composition $Hg_{0.798}Cd_{0.202}Te$ was prepared by mixing and precasting high-purity elemental constituents in a sealed, evacuated fused-silica ampule 5 mm i.d.×10 mm o.d. and 18 cm long. The resulting precast alloy was subjected to crystal growth by unidirectional solidification in the apparatus shown in FIG. 1 and under the following conditions: upper zone temperature 820° C. lower zone temperature 520° C., solidus temperature 706° C.; and furnace translation rate 0.310 μm/sec. The thickness of the thermal barrier between upper and lower zones was 0.4 cm. Upon completion of crystal growth the resulting ingot was recovered, and thin (50–300 μm) slices were taken across the ingot at varying axial locations and analyzed for alloy composition at varying radial locations by infrared transmission edge mapping. The transmission measurements were made at room temperature through 1 mm diameter areas at regularly spaced locations on a slice.

Figure 3:
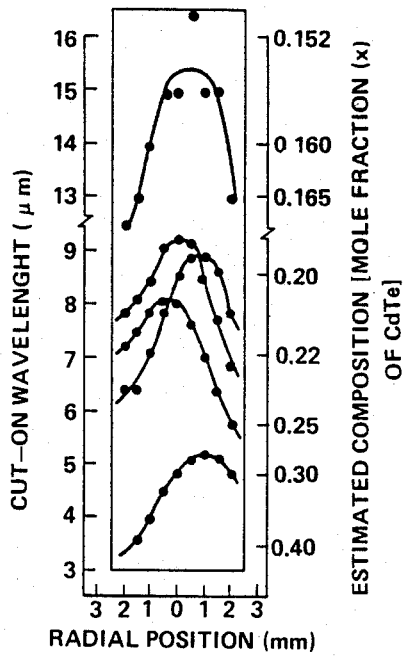
FIG. 3 is a graph showing radial compositional variations of HgCdTe samples prepared outside the parameters of the present invention.

The results obtained may be seen by reference to FIG. 3 wherein alloy composition values at varying radial positions are given for each of five slices. It may be readily seen that each slice shows severe inhomogeneity in the radial direction and that the resulting material would not meet uniformity requirements for use in an infrared detector.

EXAMPLE II

Figure 4:
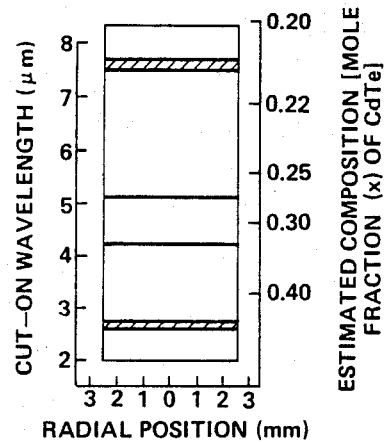
FIG. 4 is a graph showing uniform radial composition for samples prepared by the method of the invention.

An HgCdTe alloy sample of the same composition as in Example I was prepared and subjected to directional solidification by the same procedure except that a furnace translation rate of 0.068 μm/sec was used. Radial slices of the resulting ingot were taken and analyzed as in Example I, the results thereof for 4 slices being shown in FIG. 4. In each case a high degree of radial uniformity was obtained, although the top and bottom slices showed variations within the upper and lower bands depicted in FIG. 4.

The difference in results in Examples I and II is attributable to the use in Example I of too high a furnace translation rate, the remaining parameters being the same. In other experiments we have found that unacceptable radial composition variations are obtained when the barrier between zones is too thick or zone temperatures outside the formula given above are used.

While HgCdTe crystal ingots produced by the method of the invention exhibit a high degree of radial homogeneity, variations in composition are produced at varying axial locations so that only a limited number of slices from any one ingot would have substantially the same composition as one another.

While a preferred embodiment of the invention has been described using specific terms, such description is for illustrative purposes only, and it is to be understood that changes and variations may be made without departing from the spirit or scope of the following claims.

We claim:

1. A method of preparing an elongated, generally cylindrical ingot of single crystal $Hg_{1-x}Cd_xTe$ so as to form a high degree of compositional homogeneity in the radial direction of said ingot, said method comprising the steps of:

providing in an elongated sealed ampule a non-porous cast ingot of polycrystalline $Hg_{1-x}Cd_xTe$ having a predetermined but not radially homogeneous composition;

providing a directional solidification furnace having a hot upper zone, a heated lower zone having a temperature lower than said upper zone, an annular gap between said zones, and first and second annular heat pipes respectively associated with said upper and lower zones such that said second heat pipe at least partially extends into said annular gap and is separated from said first heat pipe by said thin thermal barrier;

vertically disposing said ampule in axial alignment within said furnace;

maintaining temperatures of said zones in accordance with the following formula:

$$T_U^4 - T_I^4 = T_I^4 - T_L^4$$

where $T_U$ is a selected upper zone temperature in Kelvin degrees slightly above the liquidus temperature for the said $Hg_{1-x}Cd_xTe$, $T_L$ is the lower zone temperature in Kelvin degrees and $T_I$ is the solidus temperature in Kelvin degrees for the said $Hg_{1-x}Cd_xTe$; and translating said furnace along the length of said ingot so as to move said ingot relatively towards said lower zone at a rate of less than 0.31 μm/sec so as to melt and subsequently re-solidify said ingot in radially homogeneous form.

2. The method of claim 1 wherein said thermal barrier is less than 7 mm in thickness.

3. The method of claim 2 wherein said thermal barrier is approximately 4 mm in thickness.

4. The method of claim 2 wherein the composition of said $Hg_{1-x}Cd_xTe$ is $Hg_{0.8}Cd_{0.2}Te$.

5. The method of claim 4 wherein said translation rate is about 0.068 μm/sec.

6. The method of claim 5 wherein the upper zone temperature is 820° C. and the lower zone temperature is 520° C.

* * * * *